United States Patent
Kao et al.

(10) Patent No.: US 9,263,272 B2
(45) Date of Patent: Feb. 16, 2016

(54) GATE ELECTRODES WITH NOTCHES AND METHODS FOR FORMING THE SAME

(75) Inventors: Min-Feng Kao, Chiayi (TW); Szu-Ying Chen, Toufen Township (TW); Dun-Nian Yaung, Taipei (TW); Jen-Cheng Liu, Hsin-Chu (TW); Tzu-Hsuan Hsu, Kaohsiung (TW); Feng-Chi Hung, Chu-Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 632 days.

(21) Appl. No.: 13/474,512

(22) Filed: May 17, 2012

(65) Prior Publication Data

US 2013/0277719 A1  Oct. 24, 2013

Related U.S. Application Data

(60) Provisional application No. 61/637,701, filed on Apr. 24, 2012.

(51) Int. Cl.

| | | |
|---|---|---|
| *H01L 29/02* | (2006.01) | |
| *H01L 21/265* | (2006.01) | |
| *H01L 21/28* | (2006.01) | |
| *H01L 29/423* | (2006.01) | |
| *H01L 23/544* | (2006.01) | |
| *H01L 27/146* | (2006.01) | |
| *H01L 21/762* | (2006.01) | |
| *H01L 29/66* | (2006.01) | |
| *H01L 29/78* | (2006.01) | |

(52) U.S. Cl.
CPC ...... *H01L 21/2652* (2013.01); *H01L 21/28114* (2013.01); *H01L 21/76229* (2013.01); *H01L 23/544* (2013.01); *H01L 27/1464* (2013.01); *H01L 27/14609* (2013.01); *H01L 29/42376* (2013.01); *H01L 29/665* (2013.01); *H01L 29/6659* (2013.01); *H01L 29/7833* (2013.01); *H01L 2223/54426* (2013.01); *H01L 2223/54453* (2013.01); *H01L 2924/0002* (2013.01)

(58) Field of Classification Search
CPC ...................... H01L 21/2652; H01L 21/28114; H01L 21/76229; H01L 2223/54426; H01L 2223/54453; H01L 23/544; H01L 27/14609; H01L 27/1464; H01L 29/42376; H01L 29/665; H01L 29/6659; H01L 29/7833
See application file for complete search history.

(56) References Cited

U.S. PATENT DOCUMENTS

| | | | |
|---|---|---|---|
| 6,011,290 A * | 1/2000 | Gardner et al. ............... | 257/345 |
| 6,121,666 A | 9/2000 | Burr | |
| 2007/0023846 A1 | 2/2007 | Cox | |
| 2007/0252240 A1 | 11/2007 | Andresen et al. | |
| 2010/0022077 A1 | 1/2010 | Krull et al. | |
| 2010/0052019 A1 | 3/2010 | Yamamoto et al. | |

FOREIGN PATENT DOCUMENTS

| | | |
|---|---|---|
| JP | 2000680500 | 3/2000 |
| KR | 20110067014 | 6/2011 |

* cited by examiner

*Primary Examiner* — Meiya Li
(74) *Attorney, Agent, or Firm* — Slater & Matsil, L.L.P.

(57) ABSTRACT

A device includes a semiconductor substrate, and a Device Isolation (DI) region extending from a top surface of the semiconductor substrate into the semiconductor substrate. A gate dielectric is disposed over an active region of the semiconductor substrate, wherein the gate dielectric extends over the DI region. A gate electrode is disposed over the gate dielectric, wherein a notch of the gate electrode overlaps a portion of the DI region.

20 Claims, 11 Drawing Sheets

US 9,263,272 B2

GATE ELECTRODES WITH NOTCHES AND METHODS FOR FORMING THE SAME

PRIORITY CLAIM AND CROSS-REFERENCE

This application claims the benefit of the following provisionally filed U.S. Patent application: Application Ser. No. 61/637,701, filed Apr. 24, 2012, and entitled "Gate Electrodes with Notches and Methods for Forming the Same;" which application is hereby incorporated herein by reference.

BACKGROUND

In the manufacturing of integrated circuits, the sizes of integrated circuit devices are scaled down increasingly. For example, Complementary Metal-Oxide-Semiconductor (CMOS) Image Sensor (CIS) chips have increasingly smaller pixel sizes. Accordingly, the requirement in the DC and noise performance of the CIS chips becomes increasingly stricter. Device Isolation (DI) regions formed by well implantation are thus replacing the conventional Shallow Trench Isolation (STI) regions to isolate devices. With the formation of the DI regions using implantation rather than STI regions, the damage to silicon surfaces caused by the formation of the STI regions is eliminated.

The DI regions are formed by implanting an impurity to portions of a substrate, which portions surround the active regions of the integrate circuit devices that are to be isolated. The implanted impurity has the same conductivity type as the well regions in which the devices are formed. It is, however, difficult to control the accuracy in the overlay of the components of the integrated circuit devices with the DI regions. For example, the accuracy in the overlay between the DI regions and the overlying gate electrodes are difficult to control. In the situations the gate electrodes are misaligned to the DI regions, gate electrodes may not be able to fully separate the channel between the source and drain regions of the MOS devices formed at the DI regions. Leakage currents may occur between the source and drain regions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming implanted Device Isolation (DI) regions and a Metal-Oxide-Semiconductor (MOS) device at an active region adjacent the DI regions are provided in accordance with various exemplary embodiments. The intermediate stages of forming the implanted DI regions and the MOS device are illustrated. The variations of the embodiments are discussed. Throughout the various views and illustrative embodiments, like reference numbers are used to designate like elements.

Figure 1:
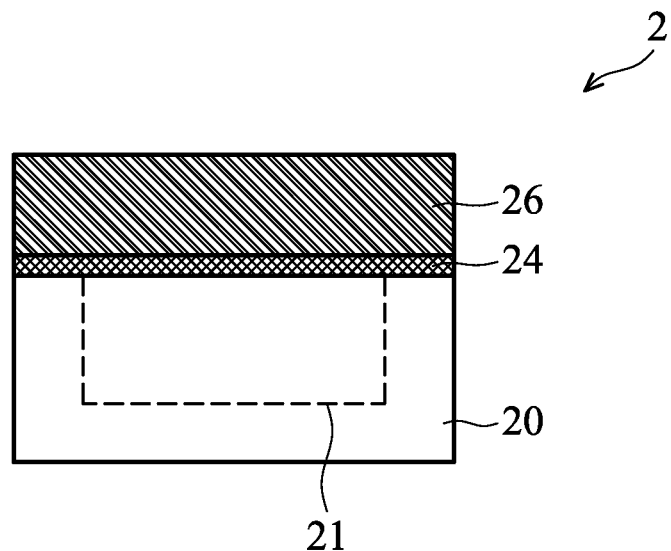
FIGS. 1 through 8C are cross-sectional views and top views of intermediate stages in the manufacturing of a Metal-Oxide-Semiconductor (MOS) device in accordance with some exemplary embodiments.

Referring to FIG. 1, wafer 2, which includes substrate 20, is provided. In some embodiments, substrate 20 is a bulk silicon substrate. In alternative embodiments, substrate 20 is formed of other semiconductor materials such as silicon carbon, silicon germanium, III-V compound semiconductor materials, or the like. Substrate 20 may also be a Silicon-On-Insulator (SOI) substrate. In some embodiments, well region 21 is formed in substrate 20, for example, through implanting a p-type or an n-type impurity into substrate 20.

Gate dielectric layer 24 and gate electrode layer 26 are formed over substrate 20. Gate dielectric layer 24 may include an oxide, a nitride, an oxynitride, a carbide, combinations thereof, and/or multi-layers thereof. Gate electrode layer 26 is conductive, and may be formed of polysilicon. Alternatively, gate electrode layer 26 is formed of other conductive materials such as metals, metal silicides, metal nitrides, and combinations thereof.

Figure 2:
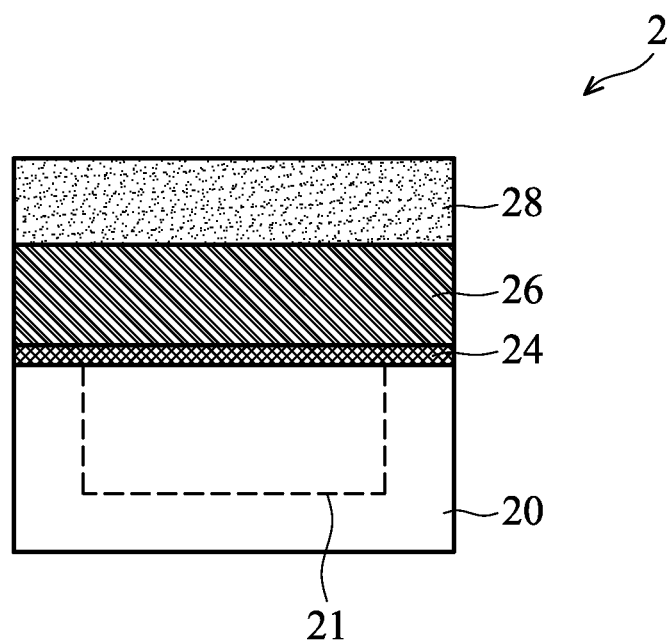
Figure 3A:
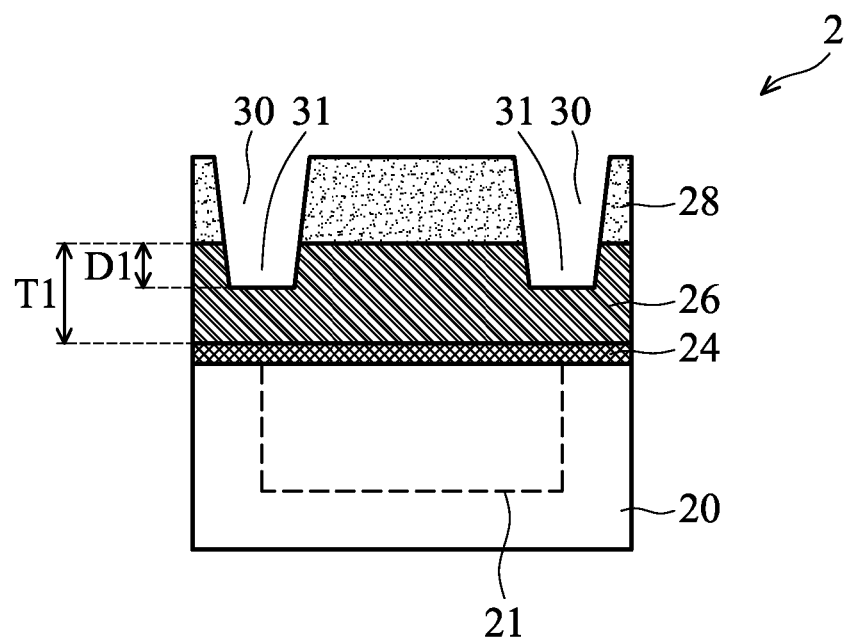
Figure 3B:
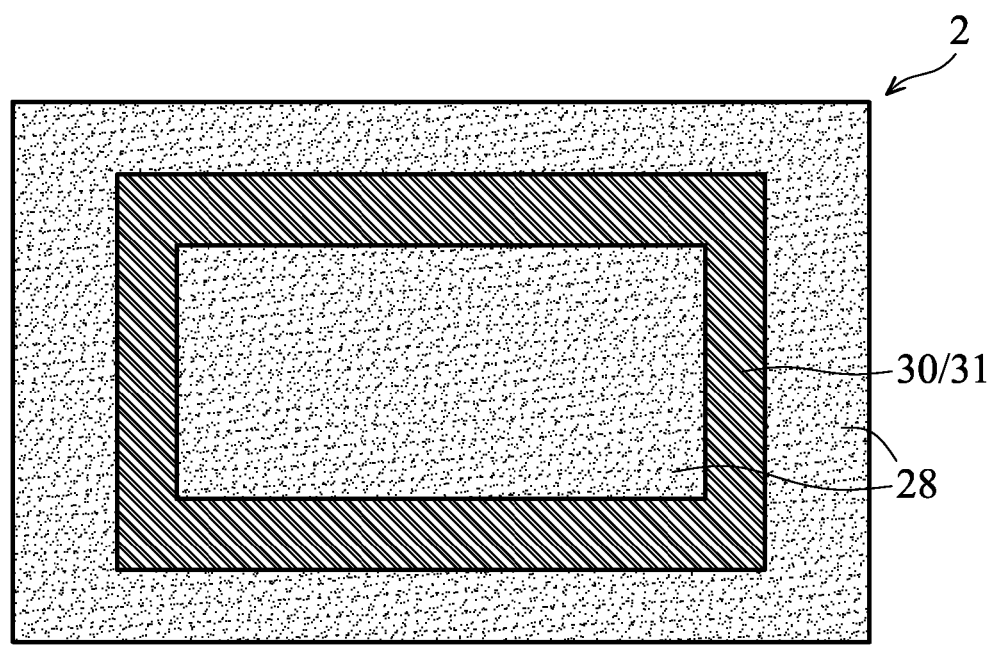

Referring to FIG. 2, hard mask 28 is formed over gate electrode layer 26. In some embodiments, hard mask 28 comprises silicon nitride. In alternative embodiments, hard mask 28 is formed of other dielectric materials such as oxynitride (SiON), silicon carbide or silicon oxide. Next, as shown in FIGS. 3A and 3B, which are a cross-sectional view and a top view, respectively, hard mask 28 is patterned to form openings 30. Openings 30, although looks like separate openings in FIG. 3A, may be parts of a continuous opening 30 (FIG. 3B). In some embodiments, as shown in FIG. 3B, opening 30 forms a full ring. In alternative embodiments, openings 30 have other layouts and shapes, depending on the shape of the devices that is to be isolated.

After the formation of openings 30, an etch step is further preformed to extend openings 30 into gate electrode layer 26 to form notch 31 in gate electrode layer 26. The formation of openings 30 and the formation of notches 31 may be performed using a same etchant or different etchants. For example, the etching of opening 30 may be performed using carbon tetrafluoride as the etchant, and the etching of gate electrode layer 26 may be performed using chlorine as the etchant. Depth D1 of notches 31 may be greater than about 50 Å, or greater than about 150 Å. Depth D1 may also be between about 50 Å and about 950 Å, for example. Depth D1 of notches 31 is also greater enough so that notches 31 are clearly distinguishable, and may be used as alignment marks in subsequent process steps. Depth D1 and thickness T1 of gate electrode layer 26 has ratio D1/T1, which may be between about 0.05 and about 0.95 in accordance with some embodiment. Ratio D1/T1 may also be between about 0.2 and about 0.8. As shown in FIGS. 3A and 3B, when openings 30 form a full ring, notches 31 also form a full ring.

Figure 4A:
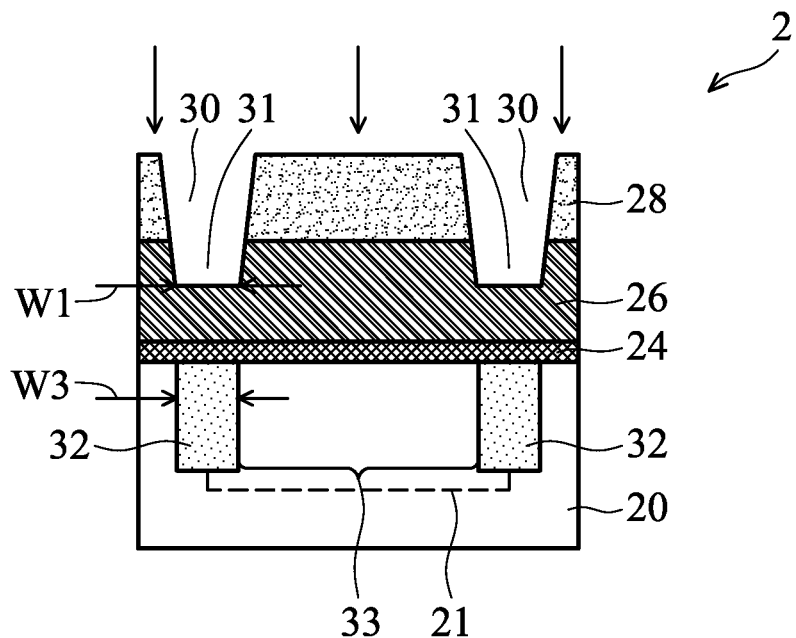
Figure 4B:
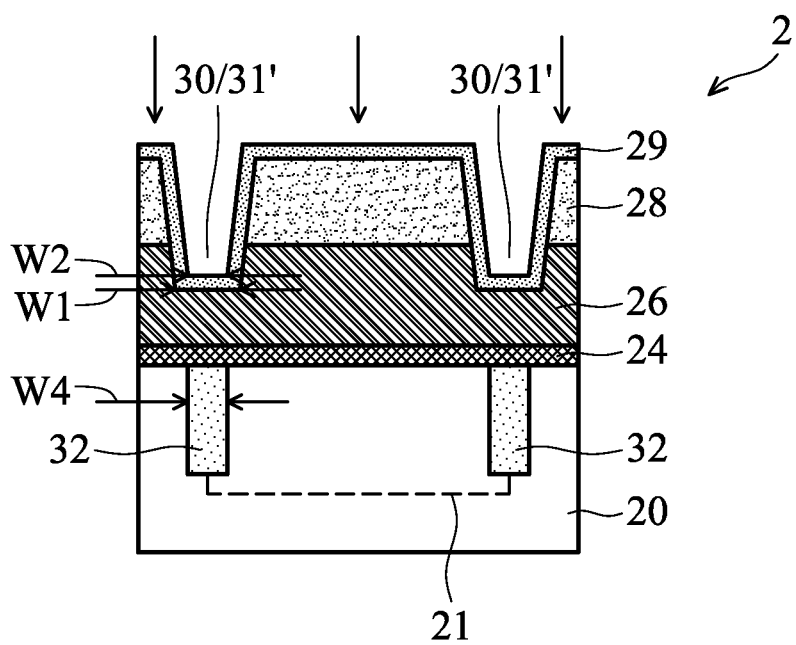

Next, as shown in FIGS. 4A and 4B, implanted DI regions 32 are formed in substrate 20. As a result, active region 33, which may be used for forming a MOS device, is encircled by implanted DI regions 32. The implantation (symbolized by arrows) is performed using an energy level high enough for the implanted impurity to penetrate through the portion of gate electrode layer 26 and gate dielectric layer 24 under notches 31, and not high enough to penetrate through hard mask 28 and the underlying portions of gate electrode layer 26. In some embodiments, the implanted impurity is a p-type impurity that, for example, comprises boron, indium, and/or the like. In alternative embodiments, the implanted impurity is an n-type impurity, for example, comprising phosphorous, arsenic, antimony, and/or the like. The conductivity type of implanted DI regions 32 is also the same as the conductivity type of well region 21.

In FIG. 4A, the implantation for forming implanted DI regions 32 is performed through notches 31 in hard mask 28. In alternative embodiments, as shown in FIG. 4B, additional hard mask 29 is formed over hard mask 28 and filled into notches 31. The unfilled portions of notches 31 are referred to as notches 31'. As a result of the formation of hard mask 29, width W2 of notches 31' is smaller than width W1 of notches 31 (also refer to FIG. 4A). Hard mask 29 may be formed as a conformal layer so that the thickness of hard mask 29 on the sidewalls of openings 30 is substantially equal to the thickness of hard mask 29 on the top surface of hard mask 28. Hard mask 29 may be formed of a same material as hard mask 29 in some embodiments. Alternatively, hard mask 29 and hard mask 28 comprise different materials. With notches 31' having reduced width W2 than width W1 of notches 31, width W4 of implanted DI regions 32 in FIG. 4B is reduced to smaller than width W3 of implanted DI regions 32 in FIG. 4A. The chip area occupied by DI regions 32 is thus reduced due to the formation of hard mask 29.

Figure 5A:
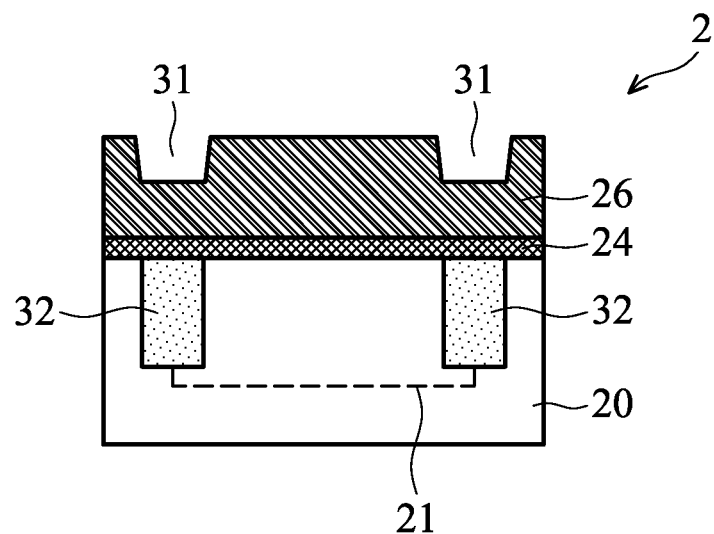
Figure 5B:
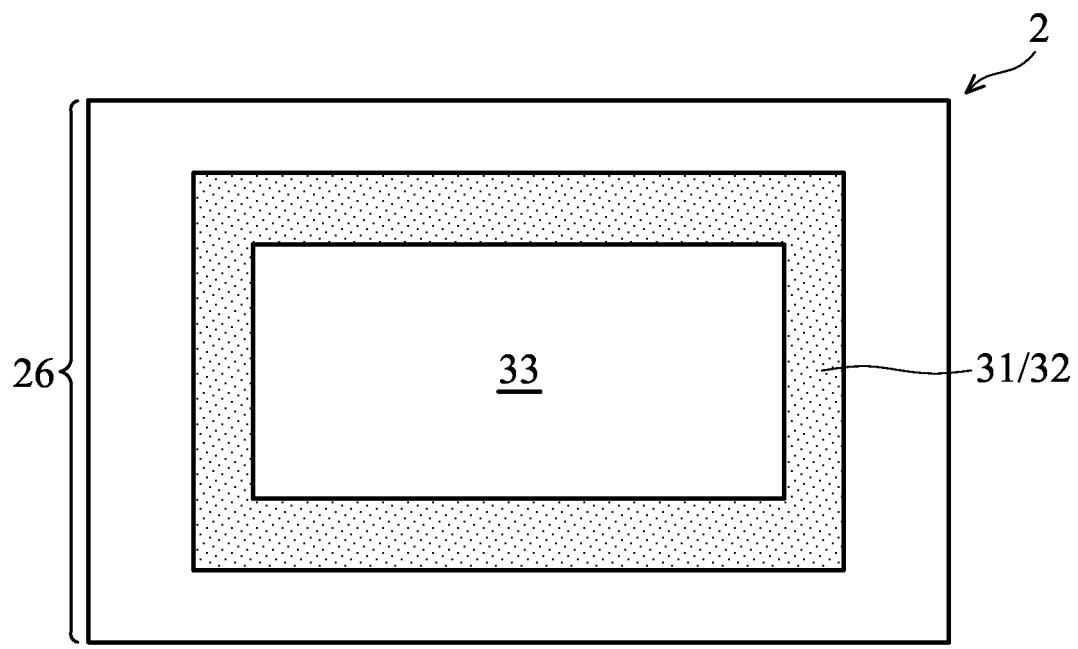

FIGS. 5A and 5B illustrate a cross-sectional view and a top view, respectively, of wafer 2 after the removal of hard mask 28 (and hard mask 29, if any). FIG. 5B illustrates that notches 31 (which forms a ring in the illustrated embodiment) overlaps implanted DI regions 32, which encircles active region 33. The edges of notches 31 are also substantially aligned to the edges of DI regions 32.

Figure 6:
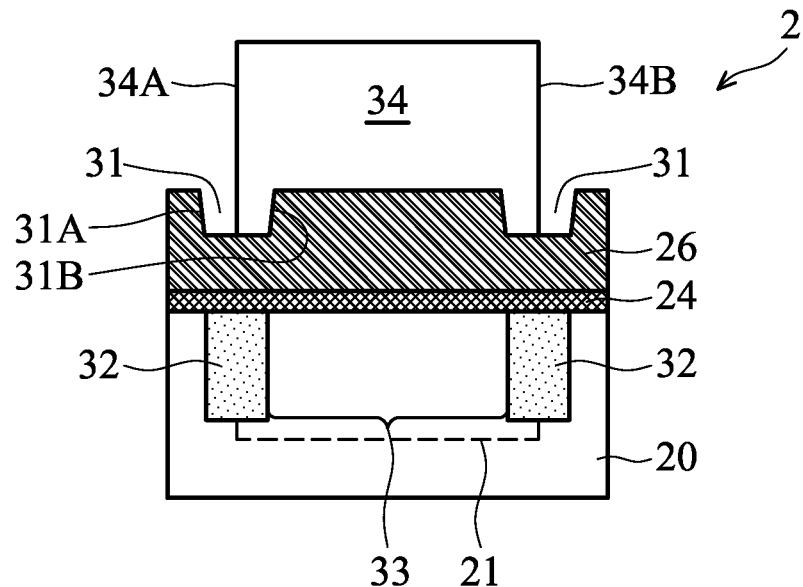

In FIG. 6, photo resist 34 is formed and patterned. The patterned photo resist 34 includes edges 34A and 34B. One or both of edges 34A and 34B is aligned to notches 31. Notches 31 are distinguishable, and may be used as the alignment mark for finding the boundaries of active region 33. Accordingly, notches 31 are used as alignment marks to accurately align edges 34A and 34B of photo resist 34 to the underlying active region 33 and implanted DI regions 32. A portion of notches 31, for example, the right half of the illustrated left notch 31, is covered by photo resist 34, and the other portion (for example, the right half of the illustrated left notch 31) of the left notch 31 is not covered by photo resist 34.

Figure 7A:
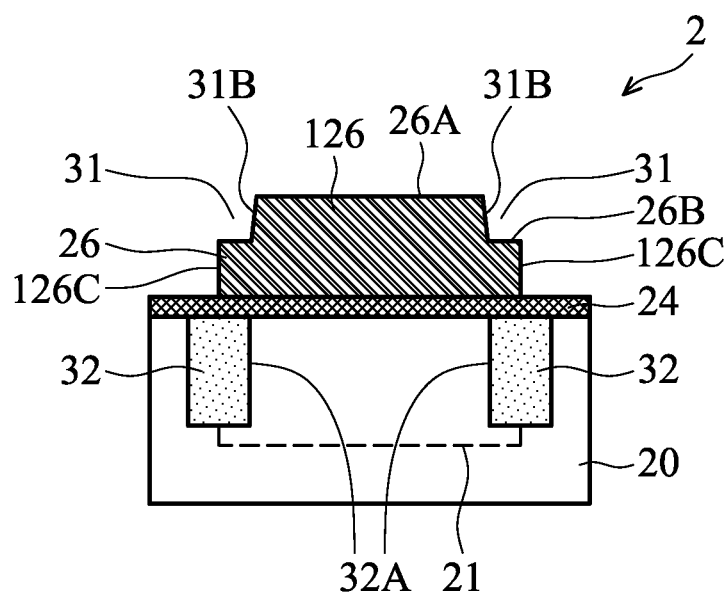
Figure 7B:
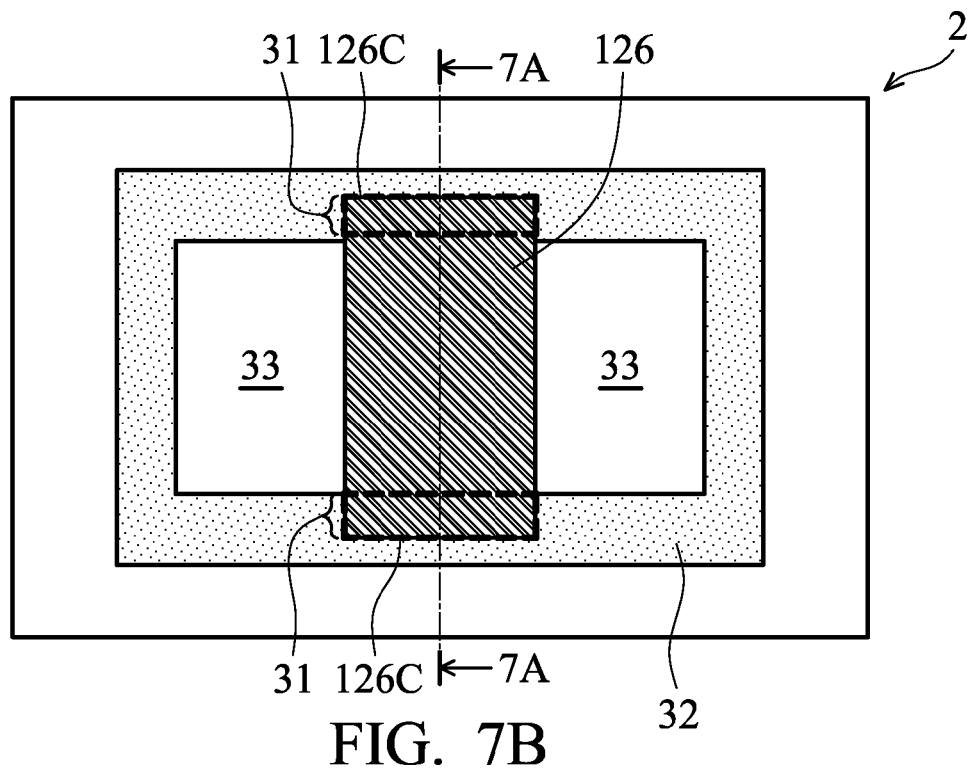

A patterning is then performed to remove the portions of gate electrode layer 26 that are uncovered by photo resist 34, so that gate electrode 126 is formed. The resulting structure is shown in FIGS. 7A and 7B. Referring back to FIG. 6, each of notches 31 includes two edges 31A and 31B facing each other. In some embodiments, edge 31A is removed along with the respective portion of gate electrode layer 26, and edge 31B remains after the etch step, as shown in FIG. 7A. The portions of gate dielectric layer 24 under the removed portion of gate electrode layer 26 may or may not be removed at this time. After the patterning of gate electrode layer 26, each of notches 31 includes a step, which is formed of top surface 26A, top surface 26B lower than top surface 26A, and edge 31B. Top surfaces 26A and 26B may be substantially flat, and may be parallel to each other. Top surface 26B extends to end 126C of gate electrode 126 in some embodiments. Edges 31B may be substantially aligned to sidewalls 32A of the respective implanted DI regions 32, which sidewalls 32A are in contact with active region 33.

Figure 7C:
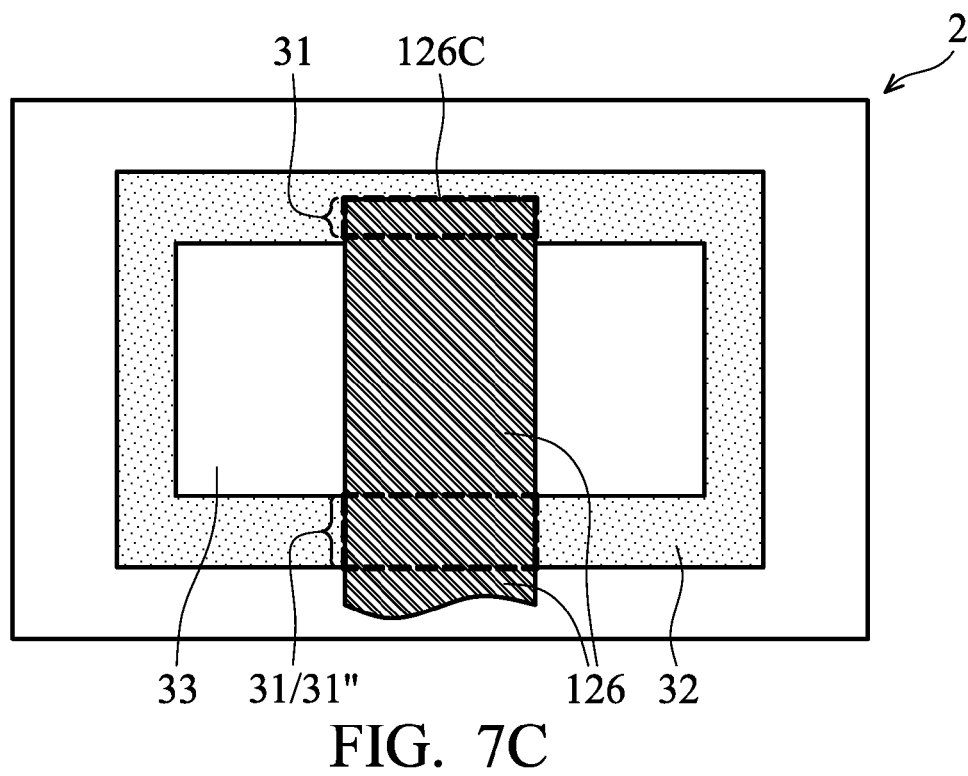

FIG. 7B is a top view of FIG. 7A, wherein the cross-sectional view in FIG. 7A is obtained from the plane crossing line 7A-7A in FIG. 7B. In some embodiments, as shown in FIG. 7B, notches 31 are formed at the opposite ends 126C of gate electrode 126. In alternative embodiments, as illustrated by dashed lines in FIG. 7C, one of notches 31 is formed at one end 126C (the upper end in FIG. 7C) of gate electrode 126, and gate electrode 126 extends beyond the other notch 31 (also marked as notch 31"). Accordingly, gate electrode 126 comprises portions on opposite sides of notch 31".

Figure 8A:
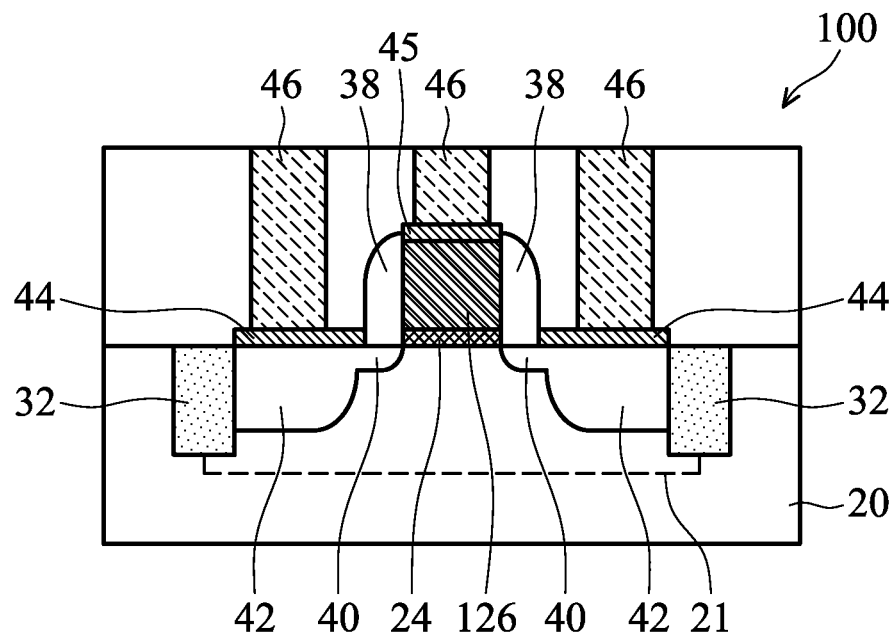
Figure 8B:
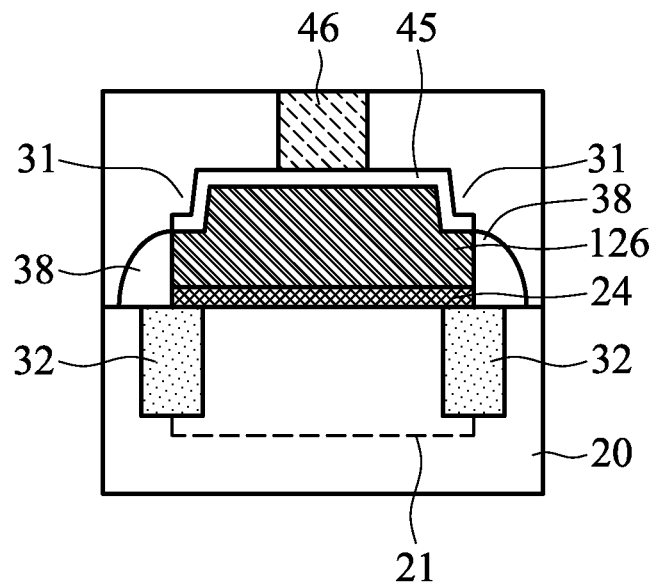
Figure 8C:
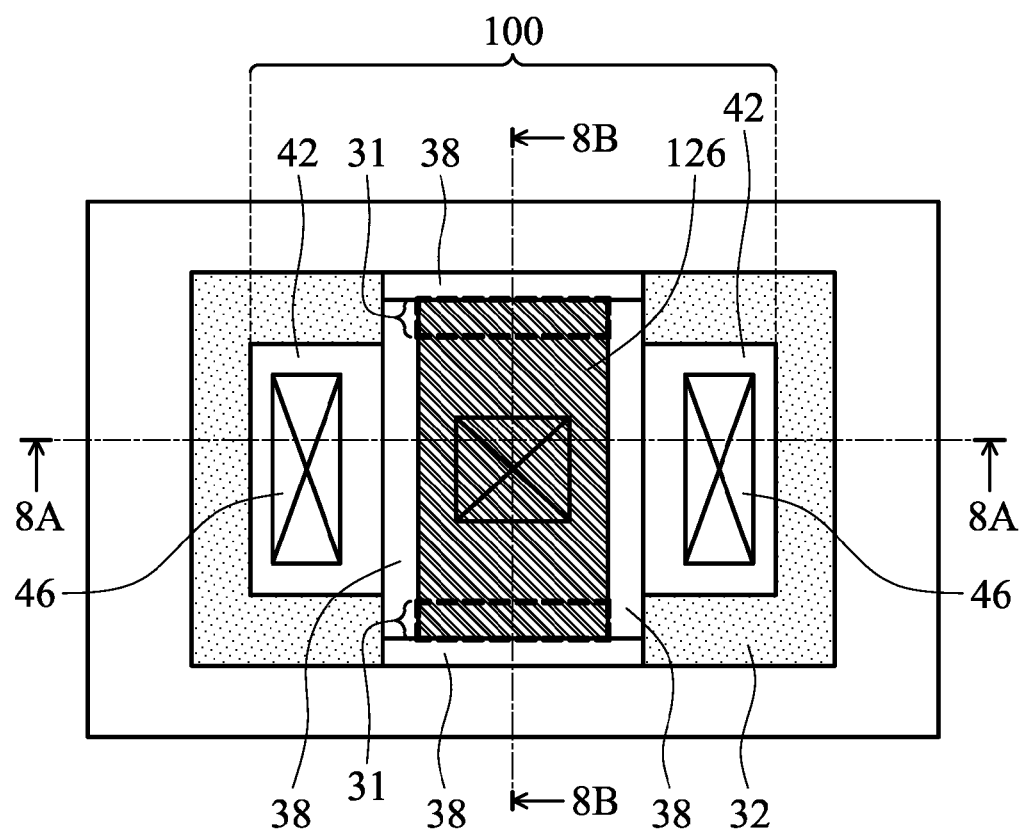

FIGS. 8A, 8B, and 8C illustrate cross-sectional views and a top view in the formation of the remaining portions of MOS device 100. FIGS. 8A and 8B are obtained from the plane crossing lines 8A-8A and 8B-8B, respectively, in FIG. 8C. Referring to FIG. 8A, the remaining portions of MOS device 100 includes gate spacers 38, source and drain extension regions 40, source and drain regions 42, source and drain silicide regions 44, gate silicide region 45, and contact plugs 46. In the formation of these components of MOS device 100, notches 31 in FIG. 7A through 7C may also be used as alignment marks. As shown in FIG. 8B, due to the existence of notches 31, gate silicide region 45 is not flat, and forms one step (or two steps), with each of the steps including a higher portion, a lower portion, and a sidewall portion. Source and drain regions 42 may be adjoining implanted DI regions 32, and have a conductivity type opposite the conductivity type of implanted DI regions 32. For example, when implanted DI regions 32 and well region 21 are of p-type, source and drain regions 42 are of n-type. Conversely, when implanted DI regions 32 and well region 21 are of n-type, source and drain regions 42 are of p-type.

Figure 9:
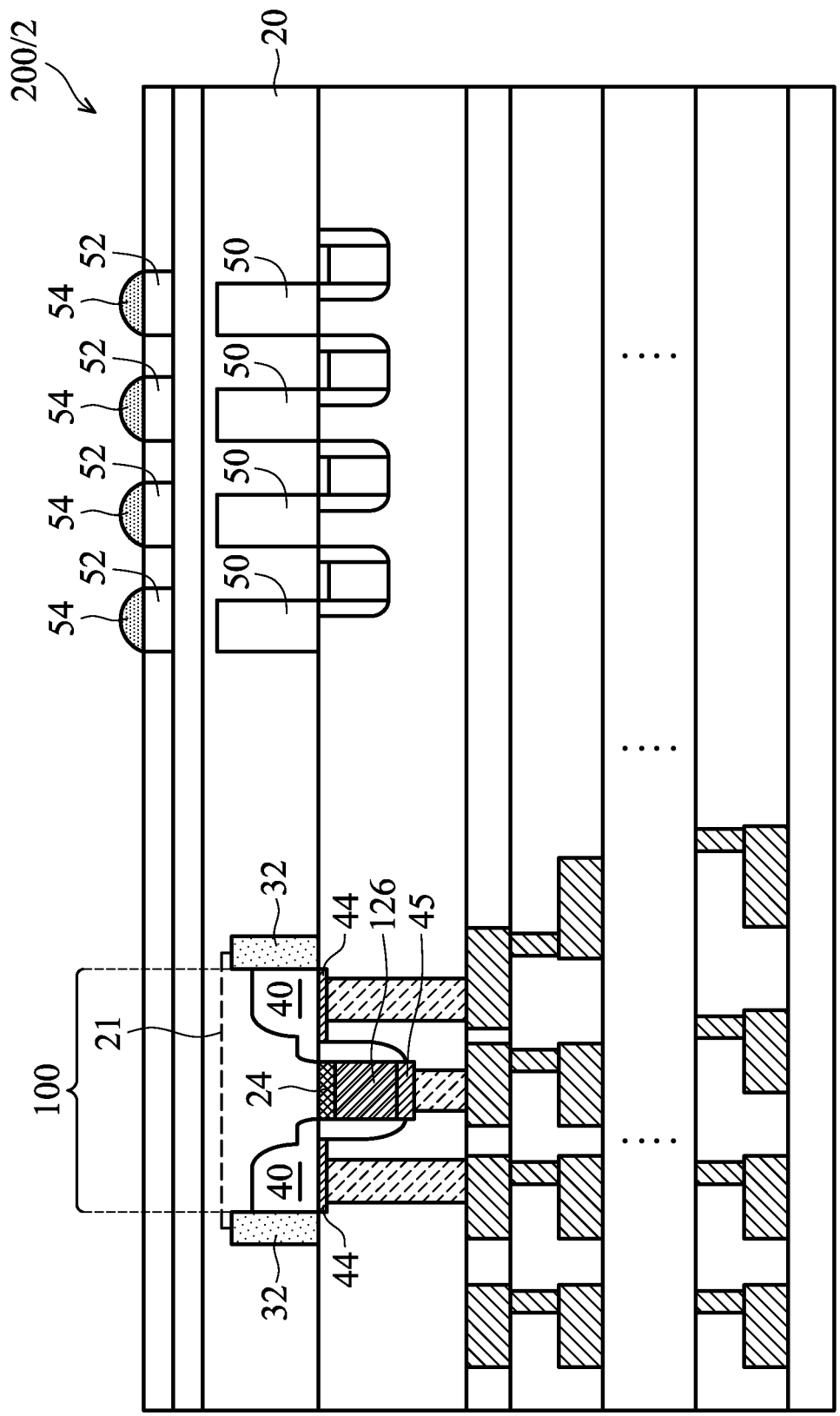
FIG. 9 illustrates a cross-sectional view of a Complementary Metal-Oxide-Semiconductor (CMOS) Image Sensor (CIS) chip comprising the MOS device as illustrated in FIGS. 8A through 8C.

In the embodiments, through the formation of notches in the gate electrode layer, the accuracy of the overlay (the alignment) in various components in integrated circuit manufacturing process is improved. The notches may be used for the formation of small-pitch devices. For example, FIG. 9 illustrates Backside Illumination (BSI) sensor chip 200 that is comprised in wafer 2. MOS device 100 and implanted DI region 32 form a part of the logic circuit in BSI image sensor chip 200. Image sensors 50, which may be formed of photo diodes, are formed at the front surface of substrate 20. On the backside of BSI image sensor chip 200 (a part of wafer 2) are color filters 52 and micro-lenses 54. Light penetrates from the backside of BSI sensor chip 200 to reach image sensors 50. BSI sensor chip 200 has a high requirement to the accuracy in the overlay of the components of MOS device 100, and the embodiments may be used.

Figure 10:
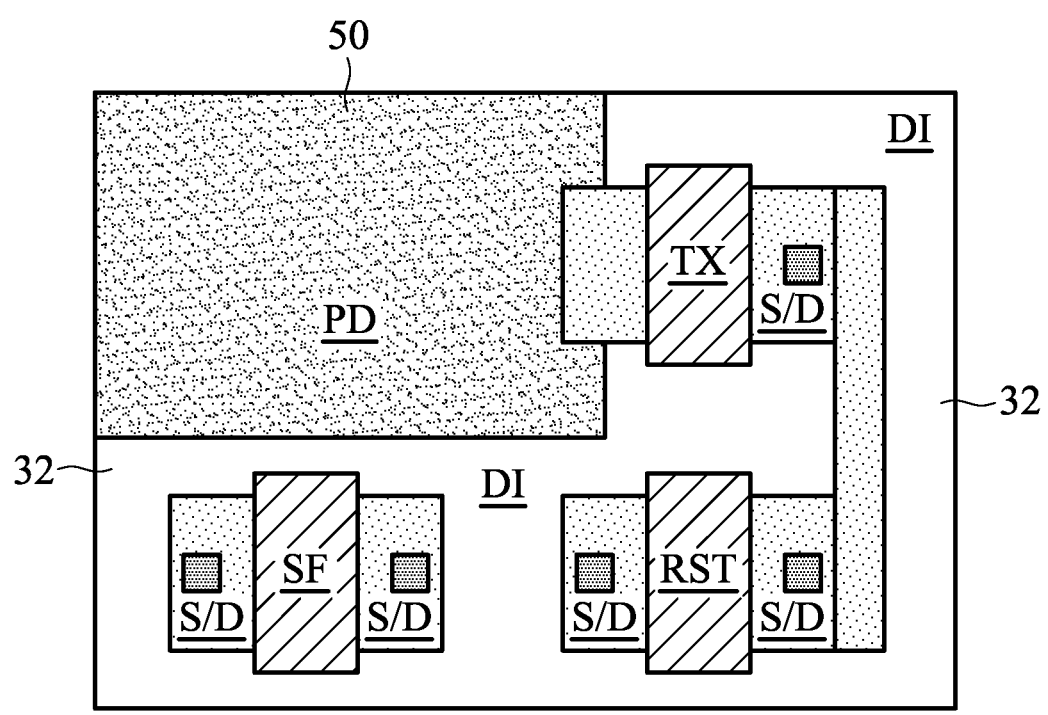
FIG. 10 illustrates a layout of an exemplary image sensor and the respective transistors serving the image sensor.
Figure 11:
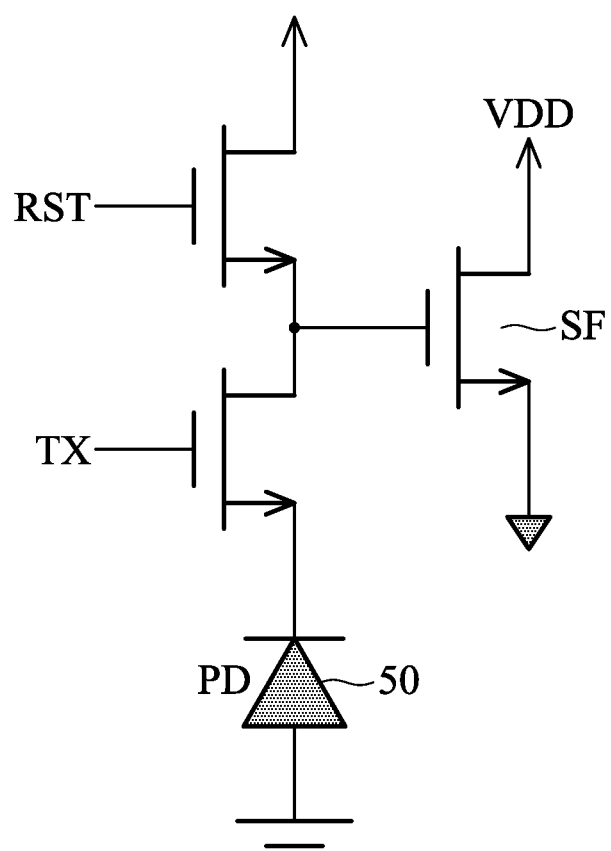
FIG. 11 illustrates a circuit diagram of the device shown in FIG. 10.

FIG. 10 illustrates a layout of an exemplary image sensor 50, which may be a Photo Diode (PD). Transfer gate transistor TX and reset transistor RST are coupled to image sensor 50. Source follower SF is formed adjacent to image sensor 50. DI region 32 is formed adjoining transfer gate transistor TX and reset transistor RST, and may encircle source follower SF. The MOS device 100 shown in FIGS. 8A through 8C may be either one of transfer gate transistor TX, reset transistor RST, and source follower SF. FIG. 11 illustrates a circuit diagram of the device shown in FIG. 10.

In the embodiments, implantation DI regions are formed, whose formation incurs less damage to the surface of substrate 20 (FIG. 1) compared to the conventional Shallow Trench Isolation (STI) region. With notches formed in gate electrodes, the notches may be used as alignment marks that are used for subsequent steps. This may improve the accuracy in the process control. For example, in the patterning of gate electrodes, the accuracy is improved, and the gate electrodes may reliably extend on the DI regions, so that the source-to-drain leakage is eliminated. By using the hard mask re-deposition as shown in FIG. 4B, the DI regions may occupy a reduced chip area. The full well capacity of the image sensor is thus increased.

In accordance with some embodiments, a device includes a semiconductor substrate, and a DI region extending from a top surface of the semiconductor substrate into the semiconductor substrate. A gate dielectric is disposed over an active region of the semiconductor substrate, wherein the gate dielectric extends over the DI region. A gate electrode is disposed over the gate dielectric, wherein a notch of the gate electrode overlaps a portion of the DI region.

In accordance with other embodiments, a device includes a semiconductor substrate, and a DI region encircling an active region of the semiconductor substrate. The DI region includes a portion of the semiconductor substrate doped with a p-type or an n-type impurity. A MOS device includes a gate dielectric over the active region and overlapping a first and a second portion of the DI region. The first and the second portions of the DI region are disposed on opposite sides of the active region. A gate electrode is over the gate dielectric. The gate electrode has an end overlapping the first portion of the DI region, and a notch at the end of the gate electrode.

In accordance with yet other embodiments, a method includes forming a gate electrode layer over a semiconductor substrate, forming a hard mask over the gate electrode layer, patterning the hard mask to form an opening in the hard mask, and etching the gate electrode layer through the opening to form a notch in the gate electrode layer. An impurity is then implanted, wherein the impurity penetrates through a portion of the gate electrode layer underlying the notch to form an implanted DI region in the semiconductor substrate. The gate electrode layer is etched to form a gate electrode of a MOS device, wherein a portion of the notch remains with the gate electrode after the step of etching.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate having an active region;
    a Device Isolation (DI) region extending from a top surface of the semiconductor substrate into the semiconductor substrate, wherein the DI region encircles the active region when viewed from a top-down perspective of the device;
    a gate dielectric over the active region and extends over the DI region; and
    a gate electrode over the gate dielectric, wherein the gate electrode has a first notch overlaps a first portion of the DI region.

2. The device of claim 1, further comprising a source region or a drain region in the active region, wherein the source region or the drain region is encircled by the DI region.

3. The device of claim 1, wherein the gate electrode comprises a first end overlapping the first portion of the DI region, and wherein the first notch is disposed at the first end of the gate electrode.

4. The device of claim 3, wherein the gate electrode further comprises:
    a second end overlapping a second portion of the DI region, wherein the first portion of the DI region and the second portion of the DI region contact a first sidewall and a second sidewall, respectively, of the active region, and the first sidewall and the second sidewall are opposite sidewalls of the active region; and
    a second notch disposed at the second end of the gate electrode.

5. The device of claim 1, wherein the gate electrode further comprises a second notch overlapping the DI region, and wherein the gate electrode comprises a first portion on a first side of the second notch and a second portion on a second side of the second notch, and wherein the first side and the second side are opposite sides of the second notch.

6. The device of claim 5, wherein an entirety of the second notch overlaps the DI region.

7. The device of claim 1, wherein the gate electrode is comprised in a Metal-Oxide-Semiconductor (MOS) device, and wherein the DI region has a first conductivity type, and source and drain regions of the MOS device have a second conductivity type opposite to the first conductivity type.

8. The device of claim 1, wherein the DI region comprises a portion of the semiconductor substrate, with the portion of the semiconductor substrate doped with a p-type or an n-type impurity.

9. A device comprising:
    a semiconductor substrate having an active region;
    a Device Isolation (DI) region encircling the active region, wherein the DI region comprises a portion of the semiconductor substrate, with the portion doped with a p-type or an n-type impurity; and
    a Metal-Oxide-Semiconductor (MOS) device comprising:
        a gate dielectric over the active region and overlapping a first portion and a second portion of the DI region, wherein the first portion and the second portion of the DI region are disposed on a first side and a second side, respectively, with the first side and the second side being opposite sides of the active region;
        a gate electrode over the gate dielectric, wherein the gate electrode comprises a first end overlapping the first portion of the DI region, and a first notch at the first end of the gate electrode; and
        a source region and a drain region in the active region, with the source region and the drain region encircled by the DI region.

10. The device of claim 9, wherein the gate electrode comprises:
    a first top surface;
    a second top surface lower than the first top surface, wherein the second top surface extends to the first end of the gate electrode; and
    a sidewall connecting the first top surface to the second top surface, wherein the first top surface and the second top surface and the sidewall form a step, and the sidewall is parallel to a channel length direction of the MOS device.

11. The device of claim 10, wherein the first top surface and the second top surface are substantially parallel to each other.

12. The device of claim 9, wherein the first portion of the DI region comprises a sidewall contacting the active region, and wherein the sidewall is substantially aligned to an edge of the first notch.

13. The device of claim 9, wherein the gate electrode comprises a second notch overlapping the second portion of the DI region, and wherein the second portion of the DI region comprises a sidewall contacting the active region and substantially aligned to an edge of the second notch.

14. A device comprising:
a semiconductor substrate comprising an active region;
a Device Isolation (DI) region surrounding the active region and extending from a top surface of the semiconductor substrate into the semiconductor substrate, wherein the DI region comprises a first sidewall and a second sidewall opposite to each other;
a gate dielectric over the active region;
a gate electrode over the gate dielectric, wherein the gate electrode has a first notch and a second notch, wherein the first notch comprises a first sidewall aligned to the first sidewall of the DI region, and the second notch comprises a second sidewall aligned to the second sidewall of the DI region; and
a source region and a drain region in the active region and encircled by the DI region, wherein a straight line interconnecting the source region and the drain region is parallel to the first sidewall of the DI region.

15. The device of claim 14, wherein the gate electrode further comprises a first edge parallel to the first sidewall of the first notch, wherein the first notch extends to the first edge.

16. The device of claim 15, wherein the gate electrode further comprises a second edge parallel to the second sidewall of the second notch, wherein the second notch extends to the second edge.

17. The device of claim 15, wherein the gate electrode comprises a first portion on a first side of the second notch and a second portion on a second side of the second notch, and wherein the first side and the second side are opposite sides of the second notch.

18. The device of claim 14, wherein the source region and the drain region have a first conductivity type opposite to a second conductivity type of the DI region.

19. The device of claim 14, wherein a portion of the first notch overlaps a portion of the DI region.

20. The device of claim 19, wherein an entirety of the first notch overlaps the DI region.

* * * * *